United States Patent
Lewis, II et al.

(10) Patent No.: US 9,642,270 B2
(45) Date of Patent: May 2, 2017

(54) RAIL SEAL FOR ELECTRONIC EQUIPMENT ENCLOSURE

(71) Applicant: CHATSWORTH PRODUCTS, INC., Westlake Village, CA (US)

(72) Inventors: Richard Evans Lewis, II, Austin, TX (US); Jose Arturo Garza, Jr., Pflugerville, TX (US); D. Brian Donowho, Austin, TX (US); Daniel Alaniz, Austin, TX (US)

(73) Assignee: Chatsworth Products, Inc., Agoura Hills, CA (US)

( * ) Notice: Subject to any disclaimer, the term of this patent is extended or adjusted under 35 U.S.C. 154(b) by 0 days.

(21) Appl. No.: 15/062,372

(22) Filed: Mar. 7, 2016

(65) Prior Publication Data

US 2016/0262277 A1    Sep. 8, 2016

Related U.S. Application Data

(63) Continuation of application No. 14/541,507, filed on Nov. 14, 2014, now Pat. No. 9,408,326, which is a
(Continued)

(51) Int. Cl.
*A47B 81/00* (2006.01)
*H05K 5/02* (2006.01)
(Continued)

(52) U.S. Cl.
CPC ......... *H05K 5/0217* (2013.01); *H05K 5/0234* (2013.01); *H05K 5/0247* (2013.01);
(Continued)

(58) Field of Classification Search
CPC ...... H05K 5/0217; H05K 5/0234; H05K 7/18; H05K 5/0247; H05K 7/183; H05K 7/20009
(Continued)

(56) References Cited

U.S. PATENT DOCUMENTS

| | | |
|---|---|---|
| 1,129,040 A | 2/1915 | McClure |
| 1,919,166 A | 7/1933 | Lavarack |

(Continued)

FOREIGN PATENT DOCUMENTS

| | | |
|---|---|---|
| AU | 2008254682 | 11/2012 |
| CN | 102177633 A | 9/2011 |

(Continued)

OTHER PUBLICATIONS

Information Disclosure Statement (IDS) Letter Regarding Common Patent Application(s), dated May 19, 2016.
(Continued)

*Primary Examiner* — Sherman Ng
(74) *Attorney, Agent, or Firm* — Tillman Wright, PLLC; James D. Wright; David R. Higgins

(57) ABSTRACT

An electronic equipment enclosure includes a frame structure, one or more panels attached to the frame structure, at least one vertical mounting rail fastened to the frame structure, and a rail seal attached to the at least one vertical mounting rail. The rail seal includes a generally flat panel portion and a seal along an edge thereof. The seal is adapted to engage at least one of the one or more panels to provide an air dam between the one or more panels and the at least one vertical mounting rail.

20 Claims, 11 Drawing Sheets

Related U.S. Application Data continuation of application No. 13/229,704, filed on Sep. 10, 2011, now Pat. No. 8,901,438.

(60) Provisional application No. 61/381,904, filed on Sep. 10, 2010.

(51) Int. Cl.
    *H05K 7/18* (2006.01)
    *H05K 7/20* (2006.01)
(52) U.S. Cl.
    CPC .............. *H05K 7/18* (2013.01); *H05K 7/183* (2013.01); *H05K 7/20009* (2013.01)
(58) Field of Classification Search
    USPC ...................................................... 312/223.2
    See application file for complete search history.

(56) References Cited

U.S. PATENT DOCUMENTS

| | | |
|---|---|---|
| 2,039,886 A | 5/1936 | Cohn |
| 2,424,217 A | 7/1947 | Bales |
| 2,459,953 A | 1/1949 | Mills |
| 2,616,142 A | 11/1952 | Tinnerman |
| 2,667,368 A | 1/1954 | Ferguson |
| 2,756,369 A | 7/1956 | Gorrie |
| 2,880,379 A | 3/1959 | Stoddart et al. |
| 2,999,190 A | 9/1961 | Armandroff et al. |
| 3,034,844 A | 5/1962 | Anderson et al. |
| 3,143,195 A | 8/1964 | Schroeder |
| 3,192,306 A | 6/1965 | Skonnord |
| 3,265,419 A | 8/1966 | Durnbaugh et al. |
| 3,404,931 A | 10/1968 | Fall et al. |
| 3,563,627 A | 2/1971 | Whipps |
| 3,585,333 A | 6/1971 | Valle et al. |
| 3,655,254 A | 4/1972 | Mayer et al. |
| 3,675,955 A | 7/1972 | Hajduk |
| 4,040,694 A | 8/1977 | Lascarrou |
| 4,101,233 A | 7/1978 | McConnell |
| 4,148,453 A | 4/1979 | Brantly |
| 4,495,234 A | 1/1985 | Tominaga et al. |
| 4,497,411 A | 2/1985 | DeBortoli |
| 4,551,577 A | 11/1985 | Byrne |
| 4,553,674 A | 11/1985 | Yoshikawa et al. |
| 4,592,602 A | 6/1986 | Kuster et al. |
| 4,643,319 A | 2/1987 | Debus et al. |
| 4,715,502 A | 12/1987 | Salmon |
| 4,796,541 A | 1/1989 | Halstrick |
| 4,814,942 A | 3/1989 | Robirds et al. |
| 4,825,339 A | 4/1989 | Boudon et al. |
| 4,869,380 A | 9/1989 | Metcalfe et al. |
| 4,941,717 A | 7/1990 | Beaulieu |
| 4,944,082 A | 7/1990 | Jones et al. |
| 4,962,443 A | 10/1990 | Cole |
| 4,964,020 A | 10/1990 | Savage et al. |
| 4,988,008 A | 1/1991 | Blum et al. |
| 5,004,107 A | 4/1991 | Sevier et al. |
| 5,009,383 A | 4/1991 | Chapman |
| 5,020,866 A | 6/1991 | McIlwraith |
| 5,052,565 A | 10/1991 | Zachrei |
| 5,149,026 A | 9/1992 | Allen |
| 5,165,770 A | 11/1992 | Hahn |
| 5,250,752 A | 10/1993 | Cutright |
| 5,263,252 A | 11/1993 | Bruggink |
| 5,275,296 A | 1/1994 | Zachrai |
| 5,284,254 A | 2/1994 | Rinderer |
| 5,294,748 A | 3/1994 | Schwenk et al. |
| 5,310,255 A | 5/1994 | Ranallo |
| 5,323,916 A | 6/1994 | Salmon |
| 5,333,950 A | 8/1994 | Zachrai |
| 5,372,262 A | 12/1994 | Benson et al. |
| 5,380,083 A | 1/1995 | Jones et al. |
| 5,380,803 A | 1/1995 | Coutant et al. |
| 5,460,441 A | 10/1995 | Hastings et al. |
| 5,463,966 A | 11/1995 | Nilsson |
| 5,488,543 A | 1/1996 | Mazura et al. |
| 5,497,444 A | 3/1996 | Wheeler |
| 5,498,073 A | 3/1996 | Charbonneau et al. |
| 5,536,079 A | 7/1996 | Kostic |
| 5,540,339 A | 7/1996 | Lerman |
| 5,542,549 A | 8/1996 | Siemon et al. |
| 5,566,836 A | 10/1996 | Lerman |
| 5,586,012 A | 12/1996 | Lerman |
| 5,639,150 A | 6/1997 | Anderson et al. |
| 5,640,482 A | 6/1997 | Barry et al. |
| 5,695,263 A | 12/1997 | Simon et al. |
| 5,713,651 A | 2/1998 | Essig et al. |
| 5,728,973 A | 3/1998 | Jorgensen |
| 5,758,002 A | 5/1998 | Walters |
| 5,791,498 A | 8/1998 | Mills |
| 5,798,485 A | 8/1998 | Rohde et al. |
| 5,806,945 A | 9/1998 | Anderson et al. |
| 5,806,946 A | 9/1998 | Benner et al. |
| 5,819,956 A | 10/1998 | Rinderer |
| 5,833,084 A | 11/1998 | Chang |
| 5,933,563 A | 8/1999 | Schaffer et al. |
| 5,938,302 A | 8/1999 | Anderson et al. |
| 5,954,525 A | 9/1999 | Siegal et al. |
| 5,961,081 A | 10/1999 | Rinderer |
| 5,975,315 A | 11/1999 | Jordan |
| 5,992,808 A | 11/1999 | Morrow |
| 5,997,117 A | 12/1999 | Krietzman |
| 6,008,621 A | 12/1999 | Madison et al. |
| 6,011,221 A | 1/2000 | Lecinski et al. |
| 6,019,446 A | 2/2000 | Laboch et al. |
| 6,036,290 A | 3/2000 | Jancsek et al. |
| 6,039,420 A | 3/2000 | Besserer et al. |
| 6,044,193 A | 3/2000 | Szentesi et al. |
| 6,047,838 A | 4/2000 | Rindoks et al. |
| 6,065,612 A | 5/2000 | Rinderer |
| 6,067,233 A | 5/2000 | English et al. |
| 6,095,345 A | 8/2000 | Gibbons |
| 6,103,973 A | 8/2000 | Sharp |
| 6,118,073 A | 9/2000 | Lau et al. |
| 6,123,203 A | 9/2000 | Gibbons |
| 6,123,400 A | 9/2000 | Nicolai et al. |
| 6,135,583 A | 10/2000 | Simon et al. |
| 6,155,658 A | 12/2000 | Woodward et al. |
| 6,179,398 B1 | 1/2001 | Martin |
| 6,181,549 B1 | 1/2001 | Mills et al. |
| 6,185,098 B1 | 2/2001 | Benavides |
| 6,201,919 B1 | 3/2001 | Puetz et al. |
| D440,210 S | 4/2001 | Larsen et al. |
| 6,223,908 B1 | 5/2001 | Kurtsman |
| 6,231,142 B1 | 5/2001 | Pochet |
| 6,238,029 B1 | 5/2001 | Marzec et al. |
| 6,245,998 B1 | 6/2001 | Curry et al. |
| 6,254,207 B1 | 7/2001 | Leneutre |
| 6,282,854 B1 | 9/2001 | Vos et al. |
| 6,293,637 B1 | 9/2001 | Anderson et al. |
| 6,299,268 B1 | 10/2001 | Carle et al. |
| 6,313,405 B1 | 11/2001 | Rinderer |
| 6,315,132 B1 | 11/2001 | Hartel et al. |
| 6,321,917 B1 | 11/2001 | Mendoza |
| 6,327,150 B1 | 12/2001 | Levy et al. |
| 6,340,141 B1 | 1/2002 | Rinderer |
| 6,347,714 B1 | 2/2002 | Fournier et al. |
| 6,349,837 B1 | 2/2002 | Serban |
| 6,401,940 B1 | 6/2002 | Hartel et al. |
| 6,410,844 B1 | 6/2002 | Bruner et al. |
| 6,422,399 B1 | 7/2002 | Castillo et al. |
| 6,425,488 B1 | 7/2002 | Notohardjono et al. |
| 6,425,648 B1 | 7/2002 | Notohardjono et al. |
| 6,478,166 B2 * | 11/2002 | Hung .................... H05K 7/183 211/175 |
| 6,481,582 B1 | 11/2002 | Rinderer |
| 6,489,565 B1 | 12/2002 | Krietzman et al. |
| 6,502,702 B1 | 1/2003 | Hsue et al. |
| 6,504,100 B2 | 1/2003 | Lawrence et al. |
| 6,510,589 B2 | 1/2003 | Schrage |
| 6,513,770 B1 | 2/2003 | Franz et al. |
| 6,517,174 B2 | 2/2003 | Sevier |
| 6,527,351 B1 | 3/2003 | Sevier et al. |

(56) References Cited

U.S. PATENT DOCUMENTS

| | | |
|---|---|---|
| 6,541,705 B1 | 4/2003 | McGrath |
| 6,554,697 B1 | 4/2003 | Koplin |
| 6,561,602 B1 | 5/2003 | Sevier et al. |
| 6,565,166 B1 | 5/2003 | Bulk et al. |
| 6,570,754 B2 | 5/2003 | Foley et al. |
| 6,601,932 B1 | 8/2003 | Helgenberg et al. |
| 6,605,777 B1 | 8/2003 | Anderson et al. |
| 6,605,782 B1 | 8/2003 | Krietzman et al. |
| 6,629,505 B1 | 10/2003 | Cronk et al. |
| 6,632,999 B2 | 10/2003 | Sempliner et al. |
| 6,655,534 B2 | 12/2003 | Williams et al. |
| 6,695,149 B1 | 2/2004 | Cote et al. |
| 6,760,531 B1 | 7/2004 | Solheid et al. |
| 6,769,551 B2 | 8/2004 | Rafferty et al. |
| 6,785,459 B2 | 8/2004 | Schmidt et al. |
| 6,788,535 B2 | 9/2004 | Dodgen et al. |
| 6,791,841 B1 | 9/2004 | Tirrell et al. |
| 6,796,437 B2 | 9/2004 | Krampotich et al. |
| 6,796,438 B2 | 9/2004 | Mendoza |
| 6,796,623 B1 | 9/2004 | Fontana et al. |
| 6,808,240 B2 | 10/2004 | Altena |
| 6,814,417 B2 | 11/2004 | Hartel et al. |
| 6,863,188 B2 | 3/2005 | Besserer et al. |
| 6,866,154 B2 | 3/2005 | Hartman et al. |
| 6,884,942 B2 | 4/2005 | McGrath et al. |
| 6,902,069 B2 | 6/2005 | Hartman et al. |
| 6,920,038 B2 | 7/2005 | Gehlbach |
| 6,930,886 B2 | 8/2005 | Velez et al. |
| 6,945,616 B2 | 9/2005 | Webster et al. |
| 6,992,247 B2 | 1/2006 | Rasmussen et al. |
| 7,000,784 B2 | 2/2006 | Canty et al. |
| 7,086,707 B2 | 8/2006 | Wyatt et al. |
| 7,093,725 B2 | 8/2006 | Hartman et al. |
| 7,141,891 B2 | 11/2006 | McNally et al. |
| 7,144,320 B2 | 12/2006 | Turek et al. |
| 7,168,576 B2 | 1/2007 | Williams |
| 7,178,679 B2 | 2/2007 | Canty et al. |
| 7,188,735 B2 | 3/2007 | Nakagawa et al. |
| 7,204,371 B2 | 4/2007 | Woolsey et al. |
| 7,255,409 B2 | 8/2007 | Hu et al. |
| 7,255,640 B2 | 8/2007 | Aldag et al. |
| 7,285,027 B2 | 10/2007 | McGrath et al. |
| 7,293,666 B2 | 11/2007 | Mattlin et al. |
| 7,312,980 B2 | 12/2007 | Ewing et al. |
| 7,316,461 B2 | 1/2008 | Wyatt et al. |
| 7,355,115 B2 | 4/2008 | Liang |
| 7,362,941 B2 | 4/2008 | Rinderer et al. |
| 7,364,243 B2 | 4/2008 | Wyatt et al. |
| 7,378,046 B2 | 5/2008 | Canty et al. |
| 7,406,242 B1 | 7/2008 | Braga |
| 7,425,678 B2 | 9/2008 | Adducci et al. |
| 7,427,713 B2 | 9/2008 | Adducci et al. |
| 7,438,638 B2 | 10/2008 | Lewis, II et al. |
| 7,458,859 B2 | 12/2008 | McGrath et al. |
| D584,251 S | 1/2009 | Lewis, II et al. |
| D584,252 S | 1/2009 | Lewis, II et al. |
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,495,169 B2 | 2/2009 | Adducci et al. |
| D588,081 S | 3/2009 | Lewis, II et al. |
| 7,498,512 B2 | 3/2009 | Adducci et al. |
| 7,504,581 B2 | 3/2009 | Adducci et al. |
| 7,507,912 B1 | 3/2009 | Sempliner et al. |
| D592,618 S | 5/2009 | Lewis, II et al. |
| 7,542,287 B2 | 6/2009 | Lewis, II et al. |
| D596,928 S | 7/2009 | Lawrence et al. |
| 7,592,541 B2 | 9/2009 | Adducci et al. |
| 7,637,771 B2 | 12/2009 | Laursen |
| 7,643,291 B2 | 1/2010 | Mallia et al. |
| 7,667,135 B2 | 2/2010 | Adducci et al. |
| D611,326 S | 3/2010 | Alaniz et al. |
| 7,697,285 B2 | 4/2010 | Donowho et al. |
| 7,718,889 B2 | 5/2010 | Rasmussen et al. |
| 7,718,891 B2 | 5/2010 | Adducci et al. |
| 7,719,835 B1 | 5/2010 | Schluter |
| 7,746,637 B2 | 6/2010 | Donowho et al. |
| 7,772,489 B2 | 8/2010 | Adducci et al. |
| 7,778,513 B2 | 8/2010 | Rinderer et al. |
| 7,795,532 B2 | 9/2010 | Walker |
| 7,804,685 B2 | 9/2010 | Krietzman |
| 7,815,246 B2 | 10/2010 | Nakamura et al. |
| 7,839,635 B2 | 11/2010 | Donowho et al. |
| 7,874,433 B2 | 1/2011 | Levesque et al. |
| 7,878,888 B2 | 2/2011 | Rasmussen et al. |
| 7,880,084 B2 | 2/2011 | Adducci et al. |
| 7,893,356 B2 | 2/2011 | Garza et al. |
| 7,894,190 B2 | 2/2011 | Davis et al. |
| 7,939,763 B2 | 5/2011 | Jones et al. |
| 7,952,869 B2 | 5/2011 | Lewis, II et al. |
| 7,957,139 B2 | 6/2011 | Davis et al. |
| 7,973,242 B2 | 7/2011 | Jones et al. |
| 7,974,105 B2 | 7/2011 | Dean, Jr. et al. |
| 7,999,183 B2 | 8/2011 | Garza et al. |
| 8,003,890 B2 | 8/2011 | Donowho et al. |
| 8,035,965 B2 | 10/2011 | Adducci et al. |
| 8,040,673 B2 | 10/2011 | Krietzman |
| 8,049,109 B2 | 11/2011 | Sempliner et al. |
| 8,087,979 B2 | 1/2012 | Rasmussen |
| 8,107,238 B2 | 1/2012 | Krietzman et al. |
| 8,138,419 B2 | 3/2012 | Garza et al. |
| 8,281,940 B2 | 10/2012 | Fan |
| 8,330,043 B2 | 12/2012 | Alaniz et al. |
| 8,395,046 B2 | 3/2013 | Nicewicz et al. |
| 8,403,736 B2 | 3/2013 | Rasmussen et al. |
| 8,405,984 B2 | 3/2013 | Donowho et al. |
| 8,411,465 B2 | 4/2013 | Dean, Jr. et al. |
| 8,437,147 B2 | 5/2013 | Dean, Jr. et al. |
| 8,443,987 B2 | 5/2013 | Peng et al. |
| 8,459,756 B2 | 6/2013 | Linhares et al. |
| 8,533,999 B2 | 9/2013 | Otsuka et al. |
| 8,628,158 B2 | 1/2014 | Caveney |
| 8,653,363 B2 | 2/2014 | Behrens et al. |
| 8,730,665 B2 | 5/2014 | Lewis, II et al. |
| 8,768,169 B2 | 7/2014 | Yuan |
| 8,787,023 B2 | 7/2014 | Lewis, II et al. |
| 8,901,438 B2 | 12/2014 | Lewis, II et al. |
| 9,055,677 B2 | 6/2015 | Garza, Jr. et al. |
| 9,119,329 B2 | 8/2015 | Krietzman et al. |
| 9,313,927 B2 | 4/2016 | Krietzman |
| 9,351,427 B2 | 5/2016 | Lewis, II et al. |
| 9,408,326 B2 | 8/2016 | Lewis, II et al. |
| 9,420,727 B2 | 8/2016 | Lewis, II et al. |
| 2001/0015598 A1 | 8/2001 | Sevier |
| 2002/0046979 A1 | 4/2002 | Larsen et al. |
| 2002/0074149 A1 | 6/2002 | Lawrence et al. |
| 2002/0172013 A1 | 11/2002 | Chandler |
| 2002/0195029 A1 | 12/2002 | Walton |
| 2002/0197045 A1 | 12/2002 | Schmidt et al. |
| 2003/0037953 A1 | 2/2003 | Sarkinen et al. |
| 2003/0079897 A1 | 5/2003 | Sempliner et al. |
| 2003/0118311 A1 | 6/2003 | Thibault et al. |
| 2004/0007372 A1 | 1/2004 | Krietzman et al. |
| 2004/0016708 A1 | 1/2004 | Rafferty et al. |
| 2004/0016713 A1 | 1/2004 | Wyatt et al. |
| 2004/0020873 A1 | 2/2004 | Henderson |
| 2004/0050808 A1 | 3/2004 | Krampotich et al. |
| 2004/0069725 A1 | 4/2004 | Adducci et al. |
| 2004/0146266 A1 | 7/2004 | Solheid et al. |
| 2004/0173545 A1 | 9/2004 | Canty et al. |
| 2004/0183409 A1* | 9/2004 | Rinderer ............ H05K 7/1421 312/265.4 |
| 2004/0190270 A1 | 9/2004 | Aldag et al. |
| 2004/0201335 A1 | 10/2004 | Davis |
| 2004/0226900 A1 | 11/2004 | Canty et al. |
| 2004/0231875 A1 | 11/2004 | Rasmussen et al. |
| 2004/0257766 A1* | 12/2004 | Rasmussen ........ H05K 7/20572 361/689 |
| 2005/0103734 A1 | 5/2005 | Saltzberg et al. |
| 2005/0221683 A1 | 10/2005 | McGrath et al. |
| 2005/0247650 A1 | 11/2005 | Vogel et al. |
| 2006/0043031 A1 | 3/2006 | Rinderer |
| 2006/0087792 A1 | 4/2006 | Ng et al. |
| 2006/0103270 A1 | 5/2006 | Bergesch et al. |

(56) References Cited

U.S. PATENT DOCUMENTS

| | | |
|---|---|---|
| 2006/0118321 A1 | 6/2006 | Herring et al. |
| 2006/0141921 A1 | 6/2006 | Turek et al. |
| 2006/0162948 A1 | 7/2006 | Rinderer et al. |
| 2006/0213853 A1 | 9/2006 | Schluter et al. |
| 2007/0064389 A1 | 3/2007 | Lewis, II et al. |
| 2007/0064391 A1 | 3/2007 | Lewis, II et al. |
| 2007/0081874 A1 | 4/2007 | Kamino et al. |
| 2007/0129000 A1 | 6/2007 | Rasmussen et al. |
| 2007/0183129 A1 | 8/2007 | Lewis, II et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0293138 A1 | 12/2007 | Adducci et al. |
| 2008/0035810 A1 | 2/2008 | Lewis, II |
| 2008/0037228 A1 | 2/2008 | Lewis, II |
| 2008/0062654 A1 | 3/2008 | Mattlin et al. |
| 2008/0067904 A1 | 3/2008 | Adducci et al. |
| 2008/0074849 A1 | 3/2008 | Adducci et al. |
| 2008/0130262 A1 | 6/2008 | Rinderer et al. |
| 2008/0174217 A1 | 7/2008 | Walker |
| 2008/0180004 A1 | 7/2008 | Martich et al. |
| 2008/0266789 A1 | 10/2008 | Hruby et al. |
| 2008/0289873 A1 | 11/2008 | Herring et al. |
| 2008/0316702 A1 | 12/2008 | Donowho et al. |
| 2008/0316703 A1 | 12/2008 | Donowho et al. |
| 2009/0014614 A1 | 1/2009 | Warmoth et al. |
| 2009/0059523 A1 | 3/2009 | Mallia et al. |
| 2009/0061755 A1 | 3/2009 | Calder et al. |
| 2009/0093169 A1 | 4/2009 | McGrath et al. |
| 2009/0129013 A1* | 5/2009 | Donowho .......... H05K 7/20572 361/690 |
| 2009/0151983 A1 | 6/2009 | Sempliner et al. |
| 2009/0168306 A1 | 7/2009 | Sharp et al. |
| 2009/0190307 A1 | 7/2009 | Krietzman |
| 2009/0224110 A1 | 9/2009 | Donowho et al. |
| 2009/0227197 A1 | 9/2009 | Lewis, II et al. |
| 2009/0236117 A1 | 9/2009 | Garza et al. |
| 2009/0239460 A1 | 9/2009 | Lucia et al. |
| 2009/0239461 A1 | 9/2009 | Lewis, II et al. |
| 2009/0273915 A1 | 11/2009 | Dean, Jr. et al. |
| 2009/0283488 A1 | 11/2009 | McMillan, III et al. |
| 2010/0051308 A1 | 3/2010 | Hansen et al. |
| 2010/0061059 A1 | 3/2010 | Krietzman et al. |
| 2010/0084188 A1 | 4/2010 | Rajvanshi et al. |
| 2010/0096962 A1 | 4/2010 | Rajvanshi et al. |
| 2010/0101820 A1 | 4/2010 | Alaniz et al. |
| 2010/0122830 A1 | 5/2010 | Garza et al. |
| 2010/0126750 A1 | 5/2010 | Garza et al. |
| 2010/0126751 A1 | 5/2010 | Garza et al. |
| 2010/0172092 A1 | 7/2010 | Davis et al. |
| 2010/0172093 A1 | 7/2010 | Davis et al. |
| 2010/0193241 A1 | 8/2010 | Bennett et al. |
| 2010/0193754 A1 | 8/2010 | Garza et al. |
| 2010/0200707 A1 | 8/2010 | Garza et al. |
| 2010/0243315 A1 | 9/2010 | Shumate et al. |
| 2011/0001408 A1 | 1/2011 | Caveney et al. |
| 2011/0019362 A1 | 1/2011 | Krietzman |
| 2011/0056895 A1 | 3/2011 | Tichy |
| 2011/0083873 A1 | 4/2011 | Hartman et al. |
| 2011/0148261 A1 | 6/2011 | Donowho et al. |
| 2011/0211328 A1 | 9/2011 | Dean, Jr. et al. |
| 2011/0211329 A1 | 9/2011 | Dean, Jr. et al. |
| 2011/0278060 A1 | 11/2011 | Rajvanshi et al. |
| 2011/0278250 A1* | 11/2011 | Malekmadani ........ A47B 57/10 211/134 |
| 2011/0287704 A1 | 11/2011 | Lewis, II et al. |
| 2011/0290553 A1 | 12/2011 | Behrens et al. |
| 2012/0013229 A1 | 1/2012 | Krietzman |
| 2012/0049706 A1* | 3/2012 | Cottuli ............... H05K 7/20736 312/236 |
| 2012/0062083 A1 | 3/2012 | Lewis, II et al. |
| 2012/0062084 A1 | 3/2012 | Lewis, II et al. |
| 2012/0062086 A1* | 3/2012 | Garza, Jr. ............ H05K 5/0247 312/236 |
| 2012/0062091 A1* | 3/2012 | Donowho .............. H04Q 1/062 312/351.1 |
| 2012/0063099 A1 | 3/2012 | Alaniz et al. |
| 2012/0112612 A1 | 5/2012 | Krietzman |
| 2012/0181906 A1 | 7/2012 | Caveney |
| 2012/0305307 A1 | 12/2012 | Korcz et al. |
| 2013/0160271 A1* | 6/2013 | Krietzman ............. H05K 13/04 29/428 |
| 2013/0165035 A1 | 6/2013 | Krietzman et al. |
| 2014/0034593 A1 | 2/2014 | Chen et al. |
| 2014/0132134 A1 | 5/2014 | Garza, Jr. et al. |
| 2015/0173253 A1 | 6/2015 | Lewis, II et al. |
| 2015/0250071 A1 | 9/2015 | Garza, Jr. et al. |
| 2015/0264839 A1 | 9/2015 | Lewis, II et al. |
| 2015/0282390 A1 | 10/2015 | Lewis, II et al. |
| 2015/0319872 A1 | 11/2015 | Lewis, II et al. |
| 2016/0249488 A1 | 8/2016 | Krietzman |

FOREIGN PATENT DOCUMENTS

| | | |
|---|---|---|
| DE | 7836374 | 3/1979 |
| DE | 19615759 A1 | 10/1997 |
| DE | 20207426 U1 | 9/2002 |
| EC | 000663943-0001 | 7/2007 |
| EC | 000663943-0002 | 7/2007 |
| EC | 000663943-0003 | 7/2007 |
| EC | 000663943-0004 | 7/2007 |
| EP | 0577433 | 1/1994 |
| EP | 2205054 A1 | 7/2010 |
| EP | 2429271 | 3/2012 |
| EP | 2429272 | 3/2012 |
| GB | 2366084 B | 9/2002 |
| GB | 2468823 B | 10/2012 |
| SE | 535066 C2 | 4/2012 |
| WO | 0101533 A1 | 1/2001 |
| WO | 2006055506 A2 | 5/2006 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009089307 A2 | 7/2009 |
| WO | 2009103090 A2 | 8/2009 |
| WO | 2009103090 A3 | 10/2009 |
| WO | 2009143193 A2 | 11/2009 |
| WO | 2009089307 A3 | 12/2009 |
| WO | 2009143193 A3 | 3/2010 |
| WO | 2010028384 A2 | 3/2010 |
| WO | 2010028384 A3 | 5/2010 |
| WO | 2010117699 A1 | 10/2010 |
| WO | 2011088430 A2 | 7/2011 |
| WO | 2011088438 A2 | 7/2011 |

OTHER PUBLICATIONS

Chatsworth Products, Inc., "Thermal Management Solutions," Signature Solutions Brochure, revision dated Mar. 2008, www.chatsworth.com/passivecooling (6 pages).

"European Search Report," European Patent Application No. 11275109.4 for Chatsworth Products, Inc., dated Sep. 18, 2014 (5 pages).

Hewlett-Packard Development Company, LP, HP 10000 G2 42U Rack Air Duct Installation Guide, dated Aug. 2008 (23 pages).

Panduit Corporation, Panduit Net-Access Vertical Exhaust System (VES) Specification Sheet, dated Feb. 2011 (4 pages).

Panduit Corporation, Panduit Net-Access Vertical Exhaust Duct (VED) Instructions, dated 2009 (4 pages).

Chatsworth Products, Inc. "Cabinet Airflow Baffles—Air Dam Kit for CPI Cabinet Systems," Product Data Sheet, Jun. 2004, techsupport@chatsworth.com (2 pages).

Rack Technologies Pty Ltd, "Product Catalog," Internet Web Page <http://racktechnologies.com.au/files/rt2005.pdf>, Jun. 16, 2005, retrieved from Internet Archive Wayback Machine <http://web.archive.org/web/20050616212856/http://racktechnologies.com.au/files/rt2005.pdf> as reviewed as of Apr. 29, 2016 (73 pages).

(56) References Cited

OTHER PUBLICATIONS

Information Disclosure Statement (IDS) Letter Regarding Common Patent Application(s), dated Nov. 4, 2016.

* cited by examiner

RAIL SEAL FOR ELECTRONIC EQUIPMENT ENCLOSURE

CROSS-REFERENCE TO RELATED APPLICATIONS

The present application is a U.S. continuation patent application of, and claims priority under 35 U.S.C. §120 to, U.S. non-provisional patent application Ser. No. 14/541,507, filed Nov. 14, 2014, which '507 application published on Mar. 12, 2015 as U.S. Patent Application Publication No. US 2015/0069888 A1, and which '507 application and the application publication thereof are each incorporated by reference herein in their entirety, and which '507 application is a U.S. continuation patent application of, and claims priority under 35 U.S.C. §120 to, U.S. non-provisional patent application Ser. No. 13/229,704, filed Sep. 10, 2011, which '704 application published on Mar. 15, 2012 as U.S. Patent Application Publication No. US 2012/0062084 A1 and issued as U.S. Pat. No. 8,901,438 on Dec. 2, 2014, and which '704 application and the application publication thereof are each incorporated by reference herein in their entirety, and which '704 application is a U.S. non-provisional patent application of, and claims priority under 35 U.S.C. §119(e) to, U.S. provisional patent application Ser. No. 61/381,904, filed Sep. 10, 2010, which '904 application is incorporated by reference herein in its entirety. Additionally, each of the following U.S. patent applications, and any application publication thereof, is incorporated by reference herein in its entirety:

(a) U.S. provisional patent application Ser. No. 61/381,904, filed Sep. 10, 2010, and entitled, "ELECTRONIC EQUIPMENT CABINET STRUCTURE;"
(b) U.S. provisional patent application Ser. No. 61/381,905, filed Sep. 10, 2010, and entitled, "CABLE PASS-THROUGH PANEL FOR ELECTRONIC EQUIPMENT ENCLOSURE;"
(c) U.S. provisional patent application Ser. No. 61/381,912, filed Sep. 10, 2010, and entitled, "RAIL MOUNTING CLAMP FOR ELECTRONIC EQUIPMENT ENCLOSURE;"
(d) U.S. provisional patent application Ser. No. 61/381,918, filed Sep. 10, 2010, and entitled, "VERTICAL MOUNTING RAIL WITH CABLE MANAGEMENT FEATURES;"
(e) U.S. non-provisional patent application Ser. No. 13/229,704, filed Sep. 10, 2011, published on Mar. 15, 2012 as U.S. Patent Application Publication No. US 2012/0062084 A1, entitled, "ELECTRONIC EQUIPMENT CABINET STRUCTURE," and issued on Dec. 2, 2014 as U.S. Pat. No. 8,901,438;
(f) U.S. non-provisional patent application Ser. No. 13/229,705, filed Sep. 10, 2011, published on Mar. 15, 2012 as U.S. Patent Application Publication No. US 2012/0062086 A1, and entitled, "CABLE PASS-THROUGH PANEL FOR ELECTRONIC EQUIPMENT ENCLOSURE;"
(g) U.S. non-provisional patent application Ser. No. 13/229,707, filed Sep. 10, 2011, published on Mar. 15, 2012 as U.S. Patent Application Publication No. US 2012/0062083 A1, entitled, "RAIL MOUNTING CLAMP FOR ELECTRONIC EQUIPMENT ENCLOSURE," and issued on Jul. 22, 2014 as U.S. Pat. No. 8,787,023; and
(h) U.S. non-provisional patent application Ser. No. 13/229,708, filed Sep. 10, 2011, published on Mar. 15, 2012 as U.S. Patent Application Publication No. US 2012/0062091 A1, and entitled, "VERTICAL MOUNTING RAIL WITH CABLE MANAGEMENT FEATURES."

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to electronic equipment cabinet structures and enclosures, and, in particular, to rail seals for installing on vertical mounting rails in electronic equipment cabinet structures and enclosures.

Background

Racks, frames and cabinets for mounting and storing electronic components have been well known for many years. Frames and racks are typically simple rectangular frameworks on which electronic components may be mounted, or on which other mounting members, such as shelves or brackets, may be mounted which in turn may support the electronic components. Cabinets are typically frames on which panels or doors, or both, are hung to provide aesthetic improvement, to protect the components from external influences, to provide security for the components stored inside, or for other reasons. Racks, frames and cabinets (sometimes collectively referred to hereinafter as "enclosures") are often customized in order to best accommodate the components which they are designed to store.

Air dam kits are commonly installed in an enclosure in order to establish a barrier between interior portions of the enclosure. In so doing, air dam kits are used to direct air flow within the enclosure to cool equipment installed therein. Many known air dam kits involve bulky, three-dimensional structures that are often difficult to install within an enclosure during initial set-up and are particularly difficult to retrofit into an existing enclosure. In a retrofitting process, side paneling may need to be removed from the enclosure in order to provide the necessary access point for properly installing the air dam kit. Additionally, known air dam kits can occupy substantial internal space within the enclosure, thereby obstructing the implementation of various cable routing accessories and equipment and compromising the flexibility of the enclosure for a wider range of uses.

Accordingly, a need exists for a more efficient type of air dam kit that occupies less space within an enclosure and can be installed with relative ease. Further, a need exists for a type of air dam kit that can be retrofitted into an existing enclosure through a front access point. Still further, a need exists for a type of air dam kit that is readily adaptable across a wide range of enclosure features and accessories and can accommodate front-to-back cable routing.

SUMMARY OF THE PRESENT INVENTION

The present invention includes many aspects and features. Moreover, while many aspects and features relate to, and are described in, the context of enclosures for electronic equipment, the present invention is not limited to use only in enclosures for electronic equipment, as will become apparent from the following summaries and detailed descriptions of aspects, features, and one or more embodiments of the present invention.

Broadly defined, the present invention according to a first aspect includes an electronic equipment enclosure that includes a frame structure, one or more panels attached to the frame structure, a vertical mounting rail fastened to the frame structure; and a rail seal attached to the vertical mounting rail. The rail seal includes a generally flat panel portion and a seal along an edge thereof. The seal is adapted to engage at least one of the one or more panels to provide a vertical air dam between the one or more panels and the vertical mounting rail.

In features of this aspect, the rail seal may further include one or more grommet ports in the panel portion for routing of cables therethrough; the rail seal may be attachable to the vertical mounting rail with one or more self-tapping screws; the panel portion may include a notched area for accommodating a finger cable manager; the seal may include an internal cavity extending substantially the length thereof; the seal may include a hooked portion for clamping the edge of the panel portion; and the seal may be shaped as a wiper blade.

Broadly defined, the present invention according to a second aspect includes an electronic equipment enclosure as substantially shown and described.

Broadly defined, the present invention according to a third aspect includes a rail seal for attachment to a vertical mounting rail in an electronic equipment enclosure. The rail seal includes a generally flat panel portion, a seal along an edge thereof, and one or more grommet ports in the panel portion for routing of cables therethrough. The seal is adapted to engage a panel of an electronic equipment enclosure to provide a vertical air dam therein.

In feature of this aspect, the rail seal may be attachable with one or more self-tapping screws; the panel portion may include a notched area for accommodating a finger cable manager; the seal may include an internal cavity extending substantially the length thereof; the seal may include a hooked portion for clamping the edge of the panel portion; and the seal may be shaped as a wiper blade.

Broadly defined, the present invention according to a fourth aspect includes a rail seal, for attachment to a vertical mounting rail in an electronic equipment enclosure, as substantially shown and described.

Broadly defined, the present invention according to a fifth aspect includes a method of installing a rail seal in an electronic equipment enclosure. The method includes the steps of providing a frame structure and one or more panels attached thereto to define an enclosure; clamping a seal along an edge of a panel portion to form a rail seal; attaching the rail seal to a vertical mounting rail fastened to the frame structure; and aligning the seal to rest along at least one of the one or more panels, thereby forming a vertical air dam between the one or more panels and the vertical mounting rail.

In features of this aspect, the rail seal may be attached to the vertical mounting rail with self-tapping screws; the rail seal may include one or more grommet ports extending therethrough; the method may further include the step of routing one or more cables through the one or more grommet ports; the panel portion may include a notched area for accommodating a finger cable manager; the seal may include an internal cavity extending substantially the length thereof; the seal may include a hooked portion for clamping the edge of the panel portion; and the seal may be shaped as a wiper blade.

Broadly defined, the present invention according to a sixth aspect includes a method of installing a rail seal in an electronic equipment enclosure as substantially shown and described.

Broadly defined, the present invention according to a seventh aspect includes a rail seal kit for providing a vertical air dam in an electronic equipment enclosure, the kit including a panel portion and a seal attachable along an edge thereof.

In features of this aspect, the panel portion may include one or more grommet ports for routing of cables therethrough; the seal may include an internal cavity extending substantially the length thereof; the seal may include a hooked portion for clamping the edge of the panel portion; and the seal may be shaped as a wiper blade.

Broadly defined, the present invention according to an eighth aspect includes a rail seal kit substantially as shown and described.

Broadly defined, the present invention according to a ninth aspect includes an electronic equipment enclosure. The electronic equipment enclosure includes a frame structure, one or more panels attached to the frame structure, at least one vertical mounting rail fastened to the frame structure, and a rail seal attached to the at least one vertical mounting rail. The rail seal includes a generally flat panel portion and a seal along an edge thereof. The seal is adapted to engage at least one of the one or more panels to provide an air dam between the one or more panels and the at least one vertical mounting rail.

In features of this aspect, the rail seal may further include one or more grommet ports in the panel portion for routing of cables therethrough; the rail seal may be attached to the at least one vertical mounting rail with one or more fasteners; and the fasteners may be self-tapping screws.

In further features of this aspect, the panel portion may include a notched area for accommodating a cable manager bracket mounted along a side of the at least one vertical mounting rail; and the cable manager bracket, together with a finger cable manager mounted along an opposite side of the at least one vertical mounting rail, may define a cable manager.

In further features of this aspect, the seal may include an internal cavity extending substantially the length thereof; the seal may include a hooked portion for clamping the edge of the panel portion; the seal may be shaped as a wiper blade; the seal may include a bumper portion for engagement with the one or more panels; and the seal may be composed of a rubber material.

In still further features of this aspect, the rail seal may be fastened vertically along an edge of the at least one vertical mounting rail, with the seal engaging a side panel, thereby providing a vertical air dam between the side panel and the at least one vertical mounting rail; the rail seal may be fastened horizontally between a pair of vertical mounting rails at upper horizontal ends thereof, with the seal engaging a top panel, thereby providing a horizontal air dam between the top panel and the pair of vertical mounting rails; and the rail seal may be fastened horizontally between a pair of vertical mounting rails at lower horizontal ends thereof, with the seal engaging a bottom panel, thereby providing a horizontal air dam between the bottom panel and the pair of vertical mounting rails.

Broadly defined, the present invention according to a tenth aspect includes a rail seal for attachment to a vertical mounting rail in an electronic equipment enclosure. The rail seal includes a generally flat panel portion, a seal along an edge thereof, and one or more grommet ports in the panel portion for routing of cables therethrough. The seal is adapted to engage a panel of an electronic equipment enclosure to provide an air dam therein.

In features of this aspect, the rail seal may be attachable with one or more fasteners; the fasteners may be self-tapping screws; the panel portion may include a notched area for accommodating a cable manager bracket; the seal may include an internal cavity extending substantially the length thereof; the seal may include a hooked portion for clamping the edge of the panel portion; the seal may be shaped as a wiper blade; the seal may include a bumper portion; and the seal may be composed of a rubber material.

Broadly defined, the present invention according to an eleventh aspect includes a method of installing a rail seal in an electronic equipment enclosure. The method includes providing a frame structure and one or more panels attached thereto to define an enclosure, clamping a seal along an edge of a panel portion to form a rail seal, attaching the rail seal to at least one vertical mounting rail fastened to the frame structure, and aligning the seal to rest along at least one of the one or more panels, thereby forming an air dam between the one or more panels and the at least one vertical mounting rail.

In features of this aspect, attaching the rail seal may include attaching the rail seal to the at least one vertical mounting rail with fasteners; and the fasteners may be self-tapping screws.

In further features of this aspect, the rail seal may include one or more grommet ports extending therethrough; and the method may further include routing one or more cables through the one or more grommet ports.

In further features of this aspect, the seal may include an internal cavity extending substantially the length thereof; the seal may include a hooked portion for clamping the edge of the panel portion; the seal may be shaped as a wiper blade; the seal may include a bumper portion; and the seal may be composed of a rubber material.

In another feature of this aspect, attaching the rail seal may include fastening the rail seal vertically along an edge of the at least one vertical mounting rail, and aligning the seal may include aligning the seal to rest along a side panel, thereby forming a vertical air dam between the side panel and the at least one vertical mounting rail.

In another feature of this aspect, attaching the rail seal may include fastening the rail seal horizontally between a pair of vertical mounting rails at upper horizontal ends thereof, and aligning the seal may include aligning the seal to rest along a top panel, thereby forming a horizontal air dam between the top panel and the pair of vertical mounting rails.

In still another feature of this aspect, attaching the rail seal may include fastening the rail seal horizontally between a pair of vertical mounting rails at lower horizontal ends thereof, and aligning the seal may include aligning the seal to rest along a bottom panel, thereby forming a horizontal air dam between the bottom panel and the pair of vertical mounting rails.

Broadly defined, the present invention according to a twelfth aspect includes a rail seal kit for providing an air dam in an electronic equipment enclosure. The kit includes a panel portion and a seal attachable along an edge thereof.

In features of this aspect, the panel portion may include one or more grommet ports for routing of cables therethrough; the seal may include an internal cavity extending substantially the length thereof; the seal may include a hooked portion for clamping the edge of the panel portion; the seal may be shaped as a wiper blade; the seal may include a bumper portion; and the seal may be composed of a rubber material.

In further features of this aspect, the panel portion may be adapted to be fastened vertically in an electronic equipment enclosure along an edge of a vertical mounting rail mounted therein; the panel portion may be adapted to be fastened horizontally in an electronic equipment enclosure at respective upper horizontal edges of a pair of vertical mounting rails mounted therein; and the panel portion may be adapted to be fastened horizontally in an electronic equipment enclosure at respective lower horizontal edges of a pair of vertical mounting rails mounted therein.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1A:
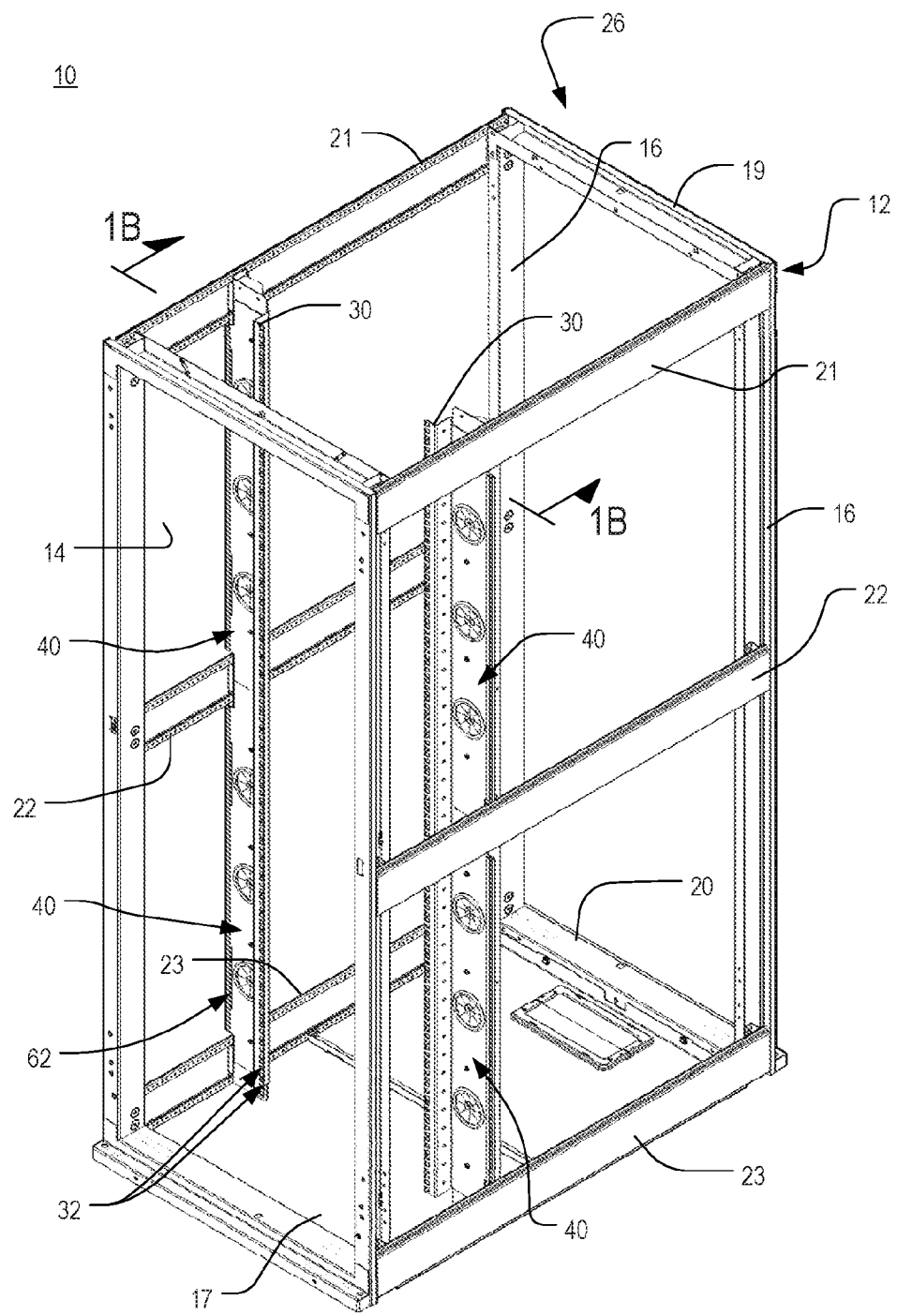
FIG. 1A is an isometric view of an electronic equipment enclosure, shown with several panels removed to reveal a pair of vertical mounting rails installed therein, each with a pair of rail seals in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of one or more preferred embodiment(s) is merely exemplary in nature and is in no way intended to limit the invention, its application, or uses.

Figure 1B:
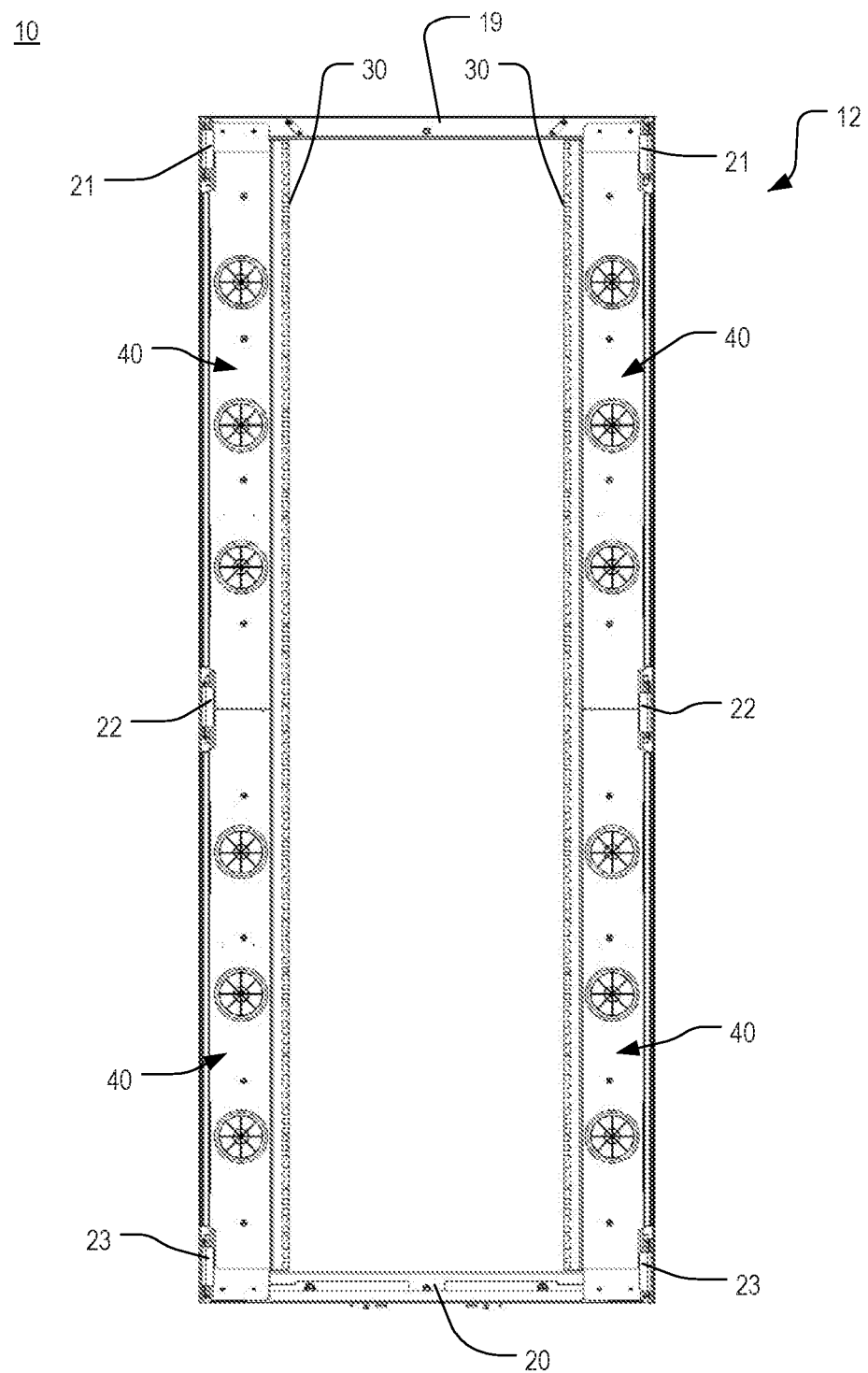
FIG. 1B is a front cross-sectional view of the electronic equipment enclosure of FIG. 1A, taken along line 1B-1B.

FIG. 1A is an isometric cross-sectional view of an electronic equipment enclosure 10, shown with several panels removed to reveal a pair of vertical mounting rails 30 installed therein, each with a pair of rail seals 40 in accordance with one or more preferred embodiments of the present invention, and FIG. 1B is a front cross-sectional view of the electronic equipment enclosure 10 of FIG. 1A, taken along line 1B-1B. The electronic equipment enclosure 10 includes a frame structure 12 formed of four vertical support posts 16, upper and lower front cross members (not illustrated), upper and lower rear cross members 19,20 and three pairs of side cross members 21,22,23. Each vertical support post 16 includes a plurality of cross member attachment apertures at each end. Two of the vertical support posts 16 are connected together at their upper and lower ends by the upper and lower front cross members, respectively, and the other two support posts 16 are connected together at their upper and lower ends by the upper and lower rear cross members 19,20, respectively. The front cross members and their respective support posts thus define a front frame (not illustrated), and the rear cross members 19,20 and their respective support posts 16 define a rear frame 26. The front and rear frames may be connected together at their respective corners by the upper, middle and lower side cross members 21,22,23.

Although the particular enclosure 10 and frame structure 12 described and illustrated herein may include various novel aspects, it will be apparent to the Ordinary Artisan that various aspects of the present invention are likewise applicable to enclosures and structures of generally conventional design and construction. Furthermore, various different connection means may be used to join the various members together. One novel connection means is illustrated in FIG. 1A. However, although not illustrated herein, it will be apparent to the Ordinary Artisan that in at least some embodiments, any of a variety of other connection means may be used instead. In this regard, other examples of conventional connection means are described in commonly-assigned U.S. Pat. No. 6,185,098, U.S. Pat. No. 7,119,282, U.S. Pat. No. 7,697,285, U.S. Patent Application Publication No. US 2009/0190307 A1, U.S. Patent Application Publication No. US 2009/0227197 A1, U.S. Patent Application Publication No. US 2009/0283488 A1, and U.S. Patent Application Publication No. US 2010/0172092 A1, the entirety of each of which is incorporated herein by reference. Although likewise not illustrated herein, the precision and the stability of each of the corners of at least some types of four post frame structures may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

Still further, it will be evident to the Ordinary Artisan that in at least some embodiments, other structural arrangements may be used to form a frame structure on which panels may be mounted to form an enclosure. For example, in at least one embodiment (not illustrated), a frame structure may be formed from only two support posts.

The enclosure 10 may further include a plurality of panels, attached to the frame structure 12, which partially or fully enclose the frame structure 12. In contemplated embodiments, the enclosure 10 may include a right and/or left panels 14 (a left panel being illustrated in FIG. 1A), a front panel (not illustrated), and a rear panel (not illustrated), one or more of which may be configured to operate as a door to the interior of the enclosure 10. The enclosure 10 may further include a bottom panel 17 as well as a generally flat top panel (not illustrated). The top panel may be sized and shaped to fit an opening defined by the four vertical support posts 16 in connection with the upper front cross member, the upper rear cross member 19, and the upper side cross members 21. The enclosure 10 may include a wide variety of different panel configurations, connection means and other features, such as those that are described in co-pending, commonly-assigned non-provisional patent application Ser. No. 13/229,704, entitled, "ELECTRONIC EQUIPMENT CABINET STRUCTURE," and Ser. No. 13/229,705, entitled, "CABLE PASS-THROUGH PANEL FOR ELECTRONIC EQUIPMENT ENCLOSURE."

As shown in FIGS. 1A and 1B, the enclosure 10 further includes one or more vertical mounting rails 30 that extend therein in a generally vertical orientation and are fastened to the frame structure 12. One contemplated mechanism for fastening the vertical mounting rail 30 to the frame structure 12 is described in the co-pending, commonly-assigned non-provisional patent application Ser. No. 13/229,707, entitled, "RAIL MOUNTING CLAMP FOR ELECTRONIC EQUIPMENT ENCLOSURE." Each vertical mounting rail 30 typically has a series of holes 32 formed therein to facilitate easy mounting of a wide variety of equipment to the frame structure 12.

As further shown in FIGS. 1A and 1B, a pair of rail seals 40 is attached to each of the vertical mounting rails 30. The rail seals 40 attach to a portion of the corresponding vertical mounting rail 30 and thereby provide a vertical air dam, in the interior of the enclosure 10, between the side panels 14 and the vertical mounting rails 30. The rail seals 40 may have any of a variety of different shapes and configurations. For instance, the rail seals 40 may be sized to correspond with an enclosure having any desired height and a width larger than 600 millimeters. In contemplated embodiments, the rail seals 40 are sized to correspond with an enclosure having a width of 750 millimeters and/or an enclosure having a width of 800 millimeters. As will be explained in greater detail below, each rail seal 40 includes a rail seal panel 42 and a seal 50. The seal 50 is preferably made from a compliant, flexible material. In one contemplated embodiment, the seal 50 is composed of a rubber material. In another contemplated embodiment, portions of the seal 50, such as the portion that engages a panel, are made from brush bristles (not illustrated).

Figure 2A:
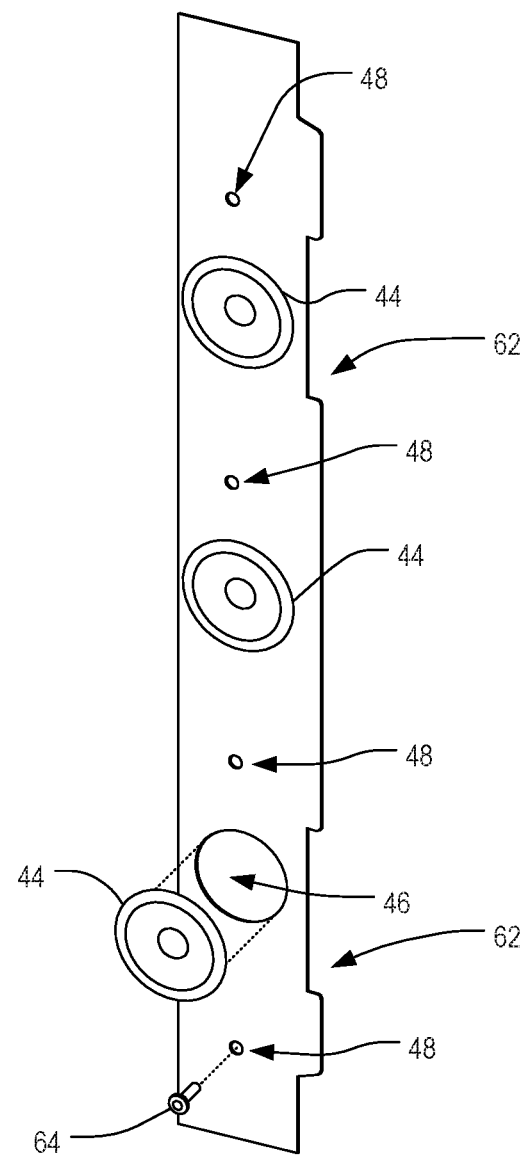
FIG. 2A is an orthogonal partially exploded view of a rail seal panel of one of the rail seals of FIG. 1A.
Figure 2B:
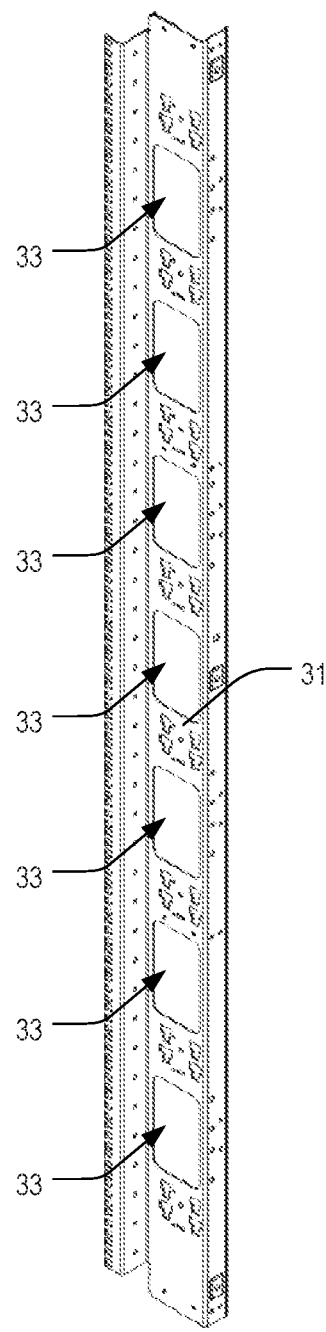
FIG. 2B is an isometric view of one of the vertical mounting rails of FIG. 1A.

FIG. 2A is an orthogonal partially exploded view of a rail seal panel 42 of one of the rail seals 40 of FIG. 1A. FIG. 2B is an isometric view of one of the vertical mounting rails 30 of FIG. 1A. As shown in FIG. 2A, the rail seal panel 42 is generally flat and includes a plurality of grommets 44, each corresponding to a grommet port 46 extending through the rail seal panel 42. The grommets 44 are configured to be removable from the rail seal panel 42 such that cables are permitted to be routed through the resulting grommet port 46. In this regard, it will be appreciated that the grommets 44 may include an adjustable opening feature such that openings in the grommets may be created or closed off without removing the grommets from the grommet ports 46. The rail seal panel 42 may accommodate any quantity or shape of grommets 44 and corresponding grommet ports 46. In one contemplated embodiment, shown in the drawings, the rail seal panel 42 includes three circular grommets 44, each with a three-inch diameter, and three corresponding circular grommet ports 46. The rail seal panel 42 is composed of a metal-based material.

The rail seal panel 42 is adapted to be attached via fasteners 64 to a vertical mounting rail 30, such as that which is shown in FIG. 2B. In particular, the real seal panel 42 includes a plurality of apertures 48 for accommodating fasteners 64. Fasteners 64, which may be any of a variety of different fastening mechanisms, extend through the apertures 48 and secure the rail seal panel 42 flatly against a surface 31 of a vertical mounting rail 30. In one contemplated embodiment, the fasteners 64 are self-tapping screws, such as M5×8 millimeter self-tapping screws. As shown in FIG. 2A, the rail seal panel 42 may have four apertures 48 to accommodate four fasteners to mount the rail seal panel 42 to a vertical mounting rail 30.

It will be appreciated that openings 33 may be provided in the surface 31 of the vertical mounting rail 30 to correspond and align with the grommet ports 46 so as to allow cables and/or air to be routed through the grommet ports 46 when the rail seal panel 42 is mounted on the vertical mounting rail 30. In particular, as perhaps most apparent from a close inspection of FIG. 1A relative to FIG. 2B, each grommet port 46 may be centered on a large rectangular opening 33 in the main surface 31 of the vertical mounting rail 30. In the contemplated embodiment, seven large rectangular openings 33 are provided, with all but the middle opening being aligned with a grommet port 46.

As further shown in FIG. 2A, the rail seal panel 42 may also include one or more notched areas 62 for accommodating additional cable management accessories implemented in the enclosure 10. In one contemplated embodiment, shown in FIG. 5, the notched areas 62 may be shaped to accommodate a cable manager bracket 70.

Figure 3:
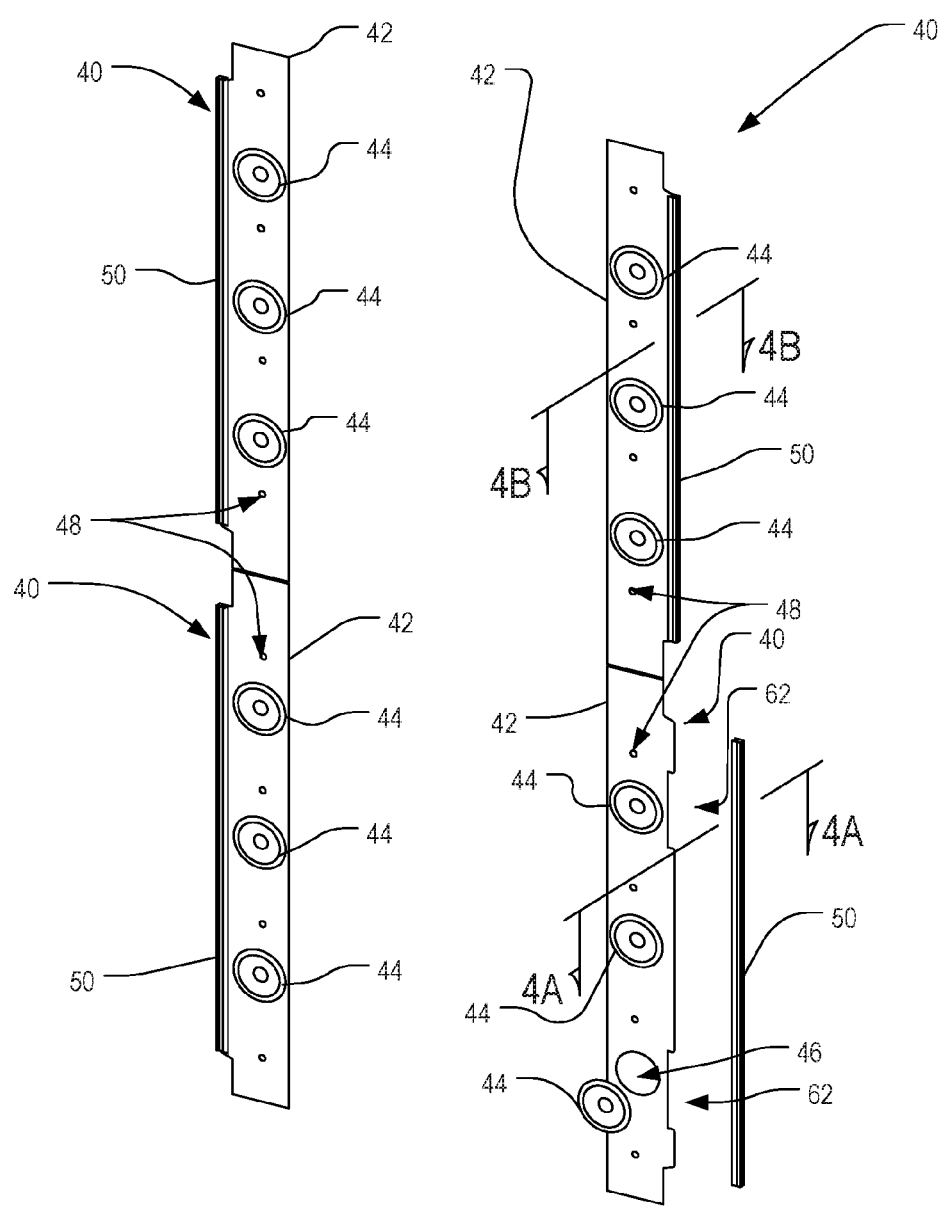
FIG. 3 is an orthogonal partially exploded view of a plurality of rail seals in accordance with FIG. 1A.

FIG. 3 is an orthogonal partially exploded view of a plurality of rail seals 40 in accordance with FIG. 1A. As shown in FIG. 3, seals 50 may be clamped or otherwise attached along edges of the rail seal panels 42, thereby providing the rail seals 40 with a flexible sealing surface at edges thereof. In particular, the seals 50 are clamped at outer-facing edges of the rail seal panels 42, which may interface with and rest against one or more side panels 14 of the enclosure 10. In this regard, the rail seals 40 provide a vertical air dam at the interior of the enclosure 10 between the side panels 14 and the vertical mounting rails 30. As further shown in FIG. 3, rail seals 40 may be aligned in an end-to-end relationship with one another.

Figure 4A:
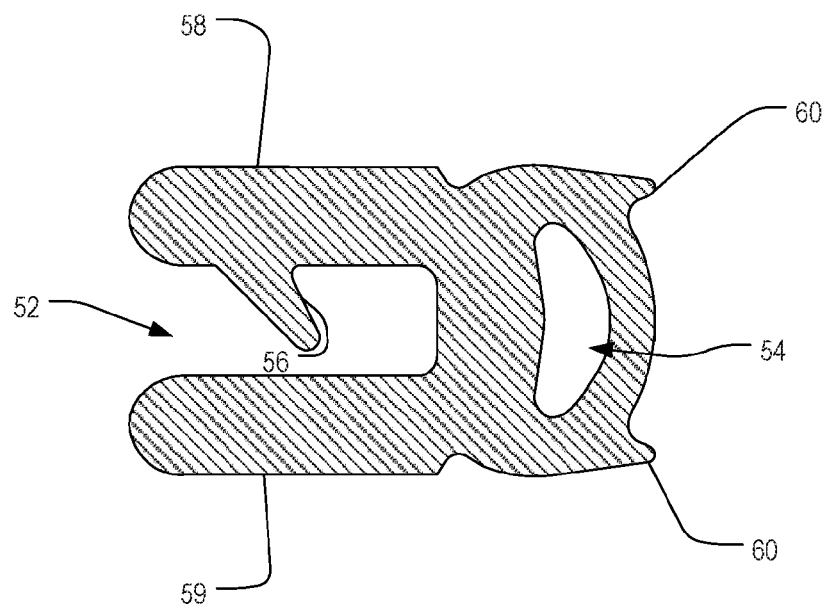
FIG. 4A is an end cross-sectional view of a seal of one of the rail seals of FIG. 3, taken along line 4A-4A.
Figure 4B:
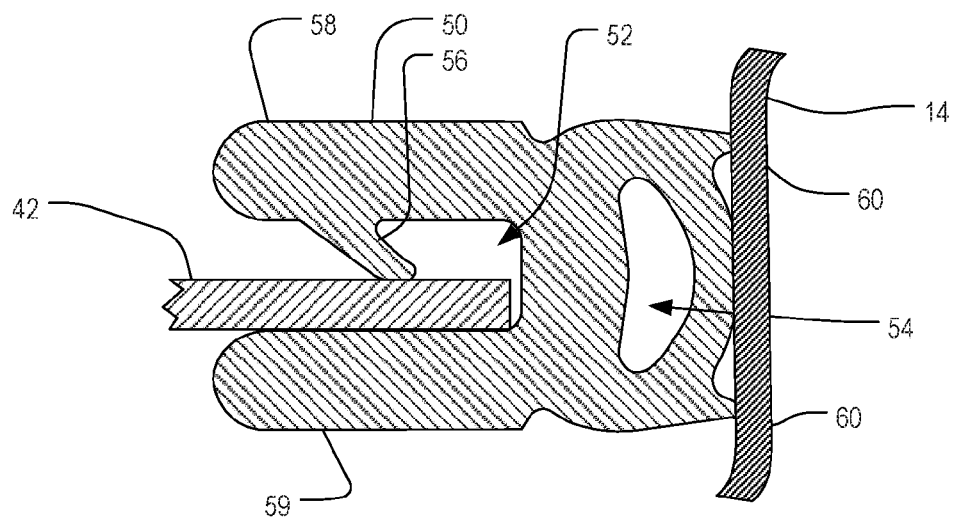
FIG. 4B is an end cross-sectional view of another one of the rail seals of FIG. 3, shown adjacent a side panel of the electronic equipment enclosure, taken along line 4B-4B.

FIG. 4A is an end cross-sectional view of a seal 50 of one of the rail seals 40 of FIG. 3, taken along line 4A-4A; and FIG. 4B is an end cross-sectional view of another one of the rail seals 40 of FIG. 3, shown adjacent a side panel 14 of the electronic equipment enclosure 10, taken along line 4B-4B. As shown in FIGS. 4A and 4B, the seal 50 of a rail seal 40 includes a pair of extension arms 58,59 extending in the same direction for positioning at either side of an edge of the rail seal panel 42. Together, the extension arms 58,59 define a channel 52 for receiving the edge of the rail seal panel 42. The seal 50 may also include a flexible interior cavity 54 at the opposite side from the extension arms 58,59. Each of the extension arms 58,59 and the interior cavity 54 may extend along the full length of the seal 50. The seal 50 may also include notched ends 60 adjacent the interior cavity 54, which may interface with another surface to help establish a seal. One of the extension arms 58 may include a hooked portion 56 to assist in clamping the seal 50 to the edge of the rail seal panel 42, as can perhaps best be seen in FIG. 4B. When attached, the hooked portion 56 may be deformed slightly in order to clamp the edge of the rail seal panel 42.

When the rail seal 40 is installed on a vertical mounting rail 30 in an electronic equipment enclosure 10, the seal 50 is pressed against a side panel 14 of the enclosure 10. The notched ends 60 interface with the side panel 14, thereby establishing a seal between the side panel 14 and the vertical mounting rail 30. The force exerted by the rail seal 40, when pressed firmly against the side panel 14, may be evenly distributed throughout the internal cavity 54, thereby enhancing the effectiveness of the seal. Furthermore, with a flexible sealing surface, the seal 50 can help establish a seal against both flat surfaces and irregular surfaces. For instance, in one contemplated embodiment, the rail seal 40 may be adapted to establish a seal against a side panel or wall that has surface features or other irregularities that create a non-flat surface, as can be seen in FIG. 4B.

Figure 5:
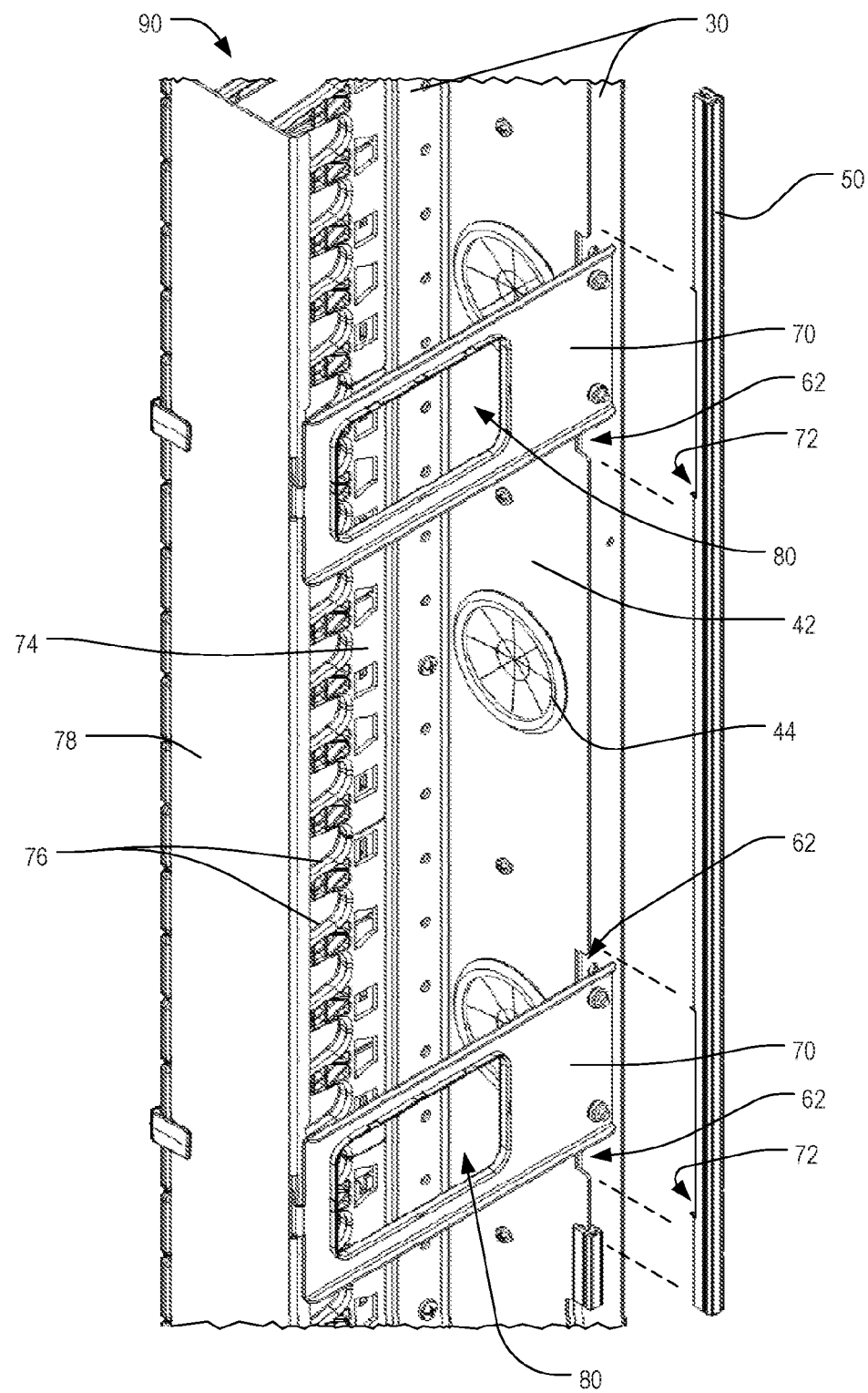
FIG. 5 is an enlarged fragmentary isometric view of a portion of a rail seal similar to one of the rail seals of FIG. 1A but shown installed with a vertical cable manager on a vertical mounting rail.

FIG. 5 is an enlarged fragmentary isometric view of a portion of a rail seal similar to one of the rail seals 40 of FIG. 1A but shown installed with a vertical cable manager 90 on a vertical mounting rail 30. In FIG. 5, and with further reference to FIG. 2B, the rail seal panel 42 is shown secured to a flat, front surface 31 of the vertical mounting rail 30. Cable manager brackets 70 are shown extending through the notched areas 62 between the seal 50 and the rail seal panel 42. The cable manager brackets 70 may be used in connection with one or more finger cable managers 74 extending from the opposite side of the vertical mounting rail 30 to establish a cable manager 90 (as explained below). In order to further accommodate the cable manager brackets 70, the seal 50 may itself include one or more notched areas or slits 72 at a portion of the inner edge thereof. Advantageously, the rail seal 40 may be installed in an enclosure 10 with or without cable manager brackets 70.

As shown in FIG. 5, the cable manager bracket 70 may be used in connection with one or more finger cable managers 74 to establish a cable manager 90 at the vertical mounting rail 30. The finger cable managers 74 each include a plurality of cable guide projections 76 for supporting and guiding individual cables into and out of the cable manager 90. Additionally, each cable manager bracket 70 itself may include an opening 80 to permit cable pass-through into and out of the cable manager 90. A cover 78 may be supported by the distal ends of the finger cable managers 74 and the cable manger brackets 70 to further define and enclose the cable manager 90. The cover is hingedly attached to one or both of the finger cable managers 74 and the cable manager brackets 70 so as to permit ready access to cables supported in the cable manager 90. As shown in FIG. 5, multiple cable manager brackets 70 may be used to help support the cover 78.

Figure 6:
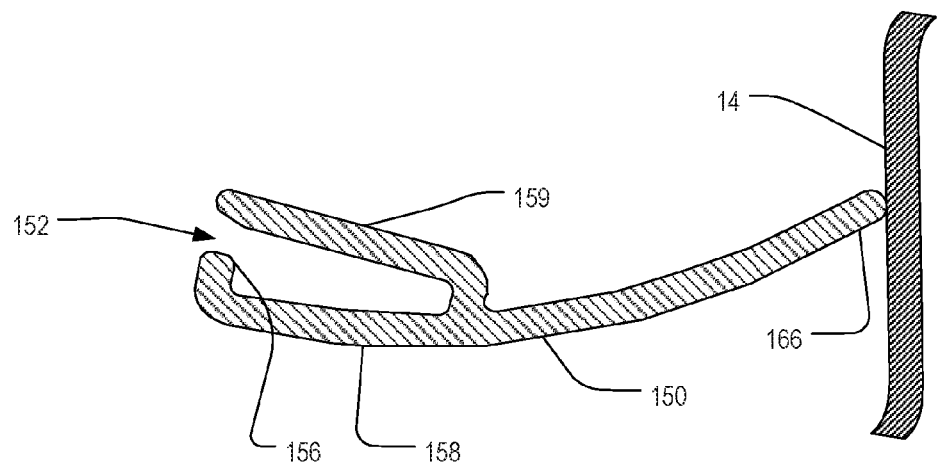
FIG. 6 is an end cross-sectional view of an alternate embodiment of a seal of a rail seal, shown adjacent a side panel of an electronic equipment enclosure.

FIG. 6 is an end cross-sectional view of an alternate embodiment of a seal 150 of a rail seal 40, shown adjacent a side panel 14 of an electronic equipment enclosure 10. As shown in FIG. 6, the seal 150 has many attributes of the seal 50 addressed hereinabove in connection with FIGS. 4A and 4B. Extension arms 158,159 jointly define a channel 152 for receiving the edge of the rail seal panel 42. One of the extension arms 158 includes a hooked portion 156 to assist in clamping the seal 150 to the edge of the rail seal panel 42. The seal 150 may also include a flexible wiper blade end 166, opposite of the extension arms 158,159, to interface with another surface to help establish a seal. Additionally, with the flexible wiper blade end 166, the seal 150 can help establish a seal against both flat surfaces and irregular surfaces. For instance, in one contemplated embodiment, a rail seal 40 utilizing the seal 150 may be adapted to establish a seal against a side panel or wall that has surface features or other irregularities that create a non-flat surface, as can be seen in FIG. 6.

Figure 7:
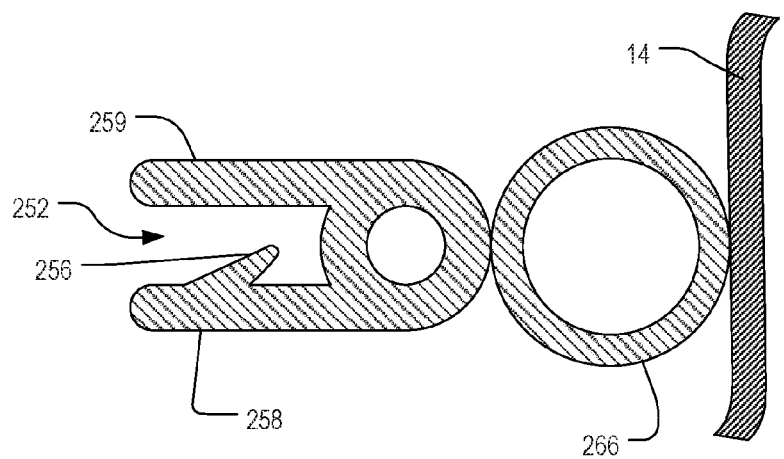
FIG. 7 is an end cross-sectional view of another alternate embodiment of a seal of a rail seal, shown adjacent a side panel of an electronic equipment enclosure.

FIG. 7 is an end cross-sectional view of another alternate embodiment of a seal 250 of a rail seal 40, shown adjacent a side panel 14 of an electronic equipment enclosure 10. As shown in FIG. 7, the seal 250 has many attributes of the seals 50,150 addressed hereinabove in connection with FIGS. 4A, 4B and 5. Extension arms 258,259 jointly define a channel 252 for receiving the edge of the rail seal panel 42. One of the extension arms 258 includes a hooked portion 256 to assist in clamping the seal 250 to the edge of the rail seal panel 42. The seal 250 may also include a bumper portion 266, opposite of the extension arms 258,259, to interface with another surface to help establish a seal. Additionally, the bumper portion 266 can help establish a seal against both flat surfaces and irregular surfaces. For instance, in one contemplated embodiment, a rail seal 40 utilizing the seal 250 may be adapted to establish a seal against a side panel or wall that has surface features or other irregularities that create a non-flat surface, as can be seen in FIG. 7.

The rail seal 40, as discussed hereinabove, may be provided in the form of, and assembled from, a kit. Kits can be provided with rail seal panels 42 and seals 50,150,250 of varying lengths and widths. In a particular kit, rail seal panels 42 may be provided with notches at ends thereof to assist in orienting and aligning the panels 42 during installation. Additionally, kits can be shipped with the seals 50,150,250 pre-attached at edges of the rail seal panels 42, thereby affording the rail seal panels 42 with additional strength and rigidity during the shipping process. In one contemplated embodiment, a kit may be provided with four rail seals 40. Such a kit may specifically include four rail seal panels 42, four seals 50,150,250, sixteen fasteners 64, and twelve grommets 44.

As can be appreciated by the Ordinary Artisan, the rail seal 40 of the present invention is capable of ready installation in an enclosure 10 from one side of the enclosure 10. In particular, the rail seal 40 is readily installable from a front of the enclosure 10, which can enable the rail seal 40 to be retrofitted in an existing enclosure with relative ease. Additionally, with a generally flat shape and a plurality of grommet ports 46, the rail seal 40 occupies less space within the enclosure 10 and is adaptable for use in connection with a range of different cable management features and options, such as front-to-back/back-to-front cable routing, and/or front-to-back/back-to-front airflow control.

Figure 8:
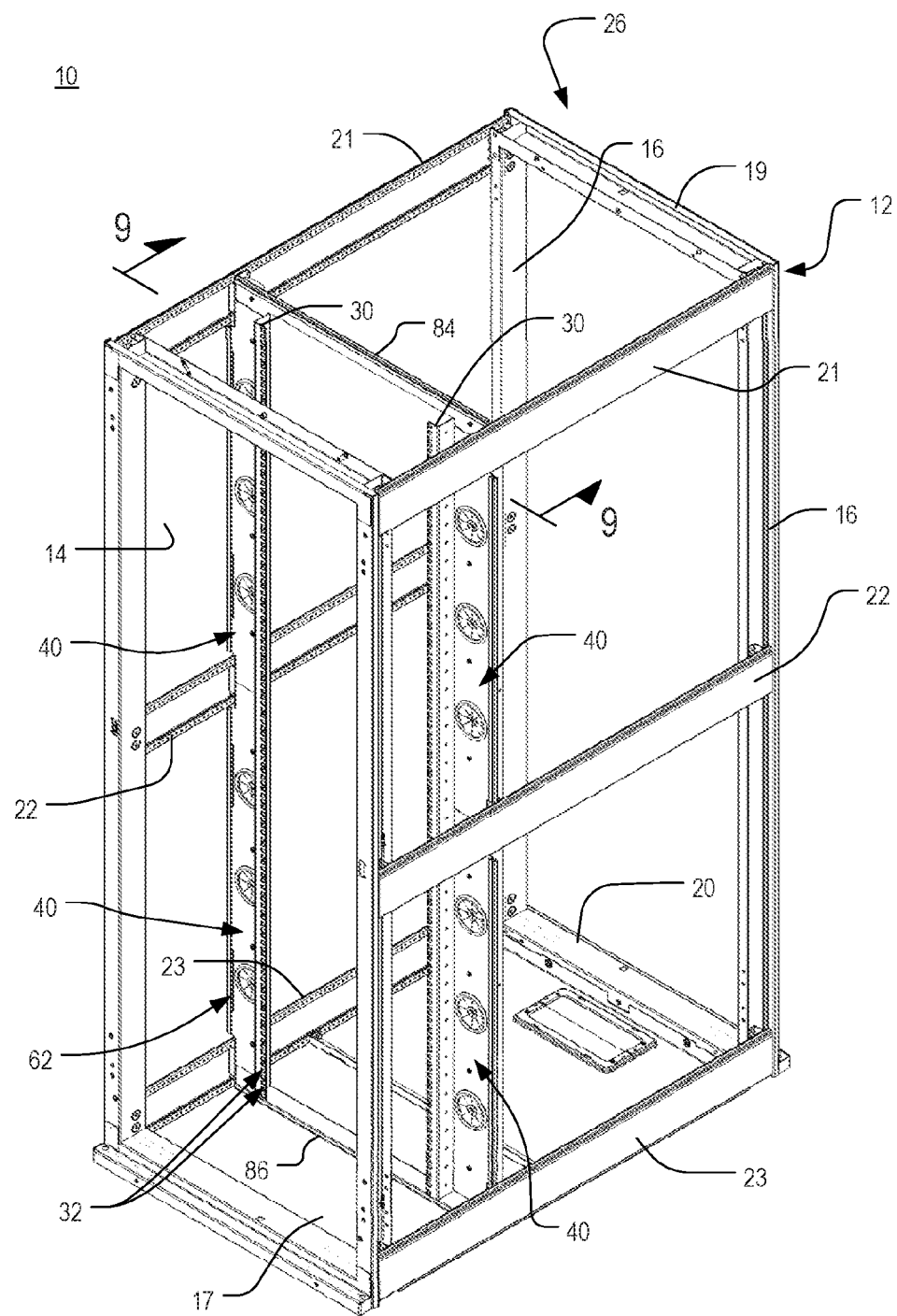
FIG. 8 is an isometric view of the electronic equipment enclosure of FIG. 1A, shown with upper and lower rail seals attached horizontally at respective upper and lower ends of the pair of vertical mounting rails.
Figure 9:
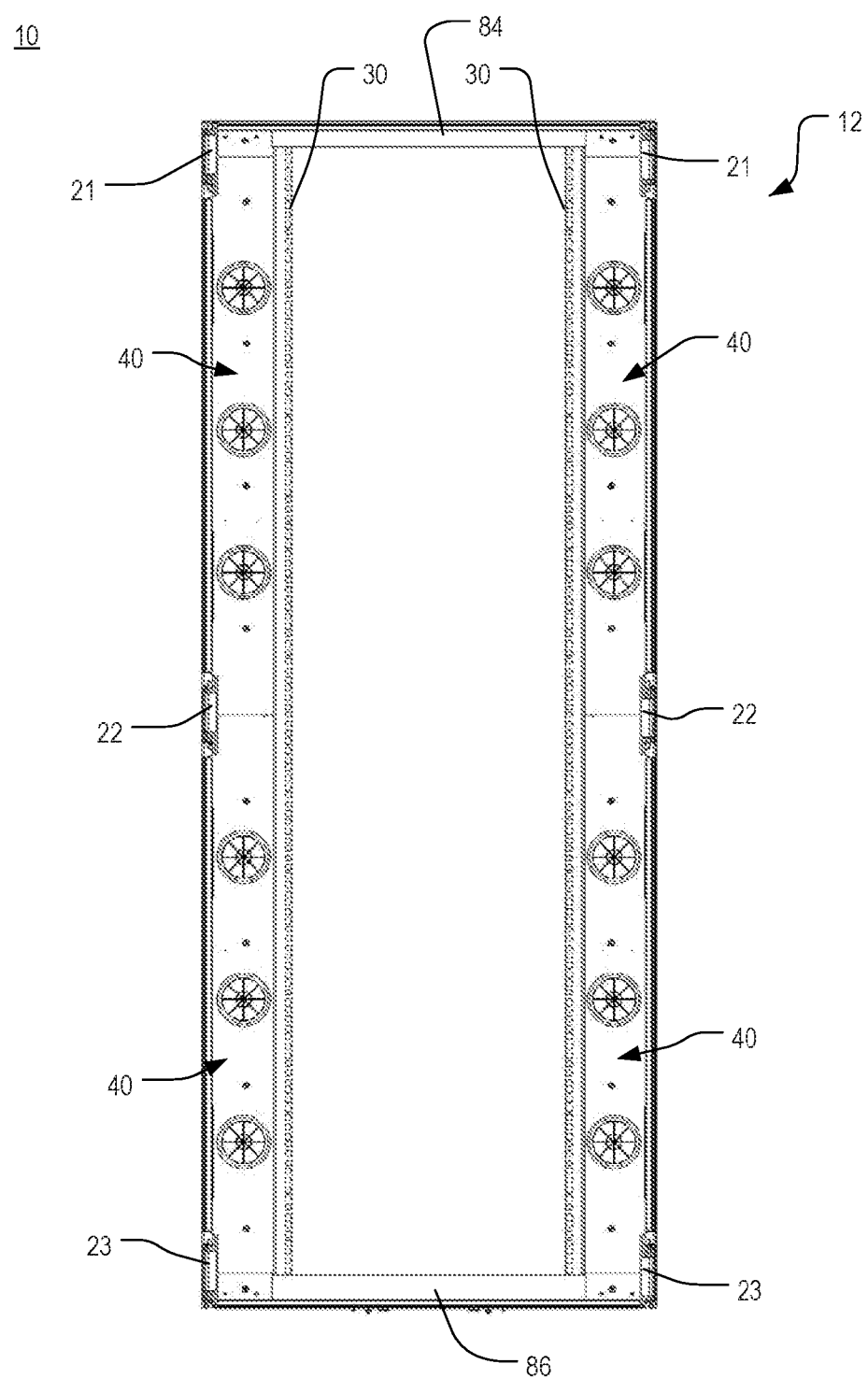
FIG. 9 is a front cross-sectional view of the electronic equipment enclosure of FIG. 8, taken along line 9-9.

FIG. 8 is an isometric view of the electronic equipment enclosure 10 of FIG. 1A, shown with upper and lower rail seals 84,86 attached horizontally at respective upper and lower ends of the pair of vertical mounting rails 30, and FIG. 9 is a front cross-sectional view of the electronic equipment enclosure 10 of FIG. 8, taken along line 9-9. As shown in FIGS. 8 and 9, the upper rail seal 84 attaches horizontally atop the pair of vertical mounting rails 30, thereby providing a horizontal air dam at the interior of the enclosure between the top panel and the pair of vertical mounting rails 30. In similar fashion, the lower rail seal 86 attaches horizontally at the respective bases of the pair of vertical mounting rails 30 at bottom edges thereof, thereby providing a horizontal air dam at the interior of the enclosure between the bottom panel 17 and the pair of vertical mounting rails 30. In this manner, the upper and lower rail seals 84,86 facilitate establishment of a seal between the vertical mounting rails 30 and the top panel (not illustrated) and bottom panel 17 of the enclosure 10 and thus help provide a barrier to airflow between interior portions of the enclosure 10. Advantageously, the upper and lower rail seals 84,86 may have any of a variety of different shapes and configurations as might be desired.

Figure 10:
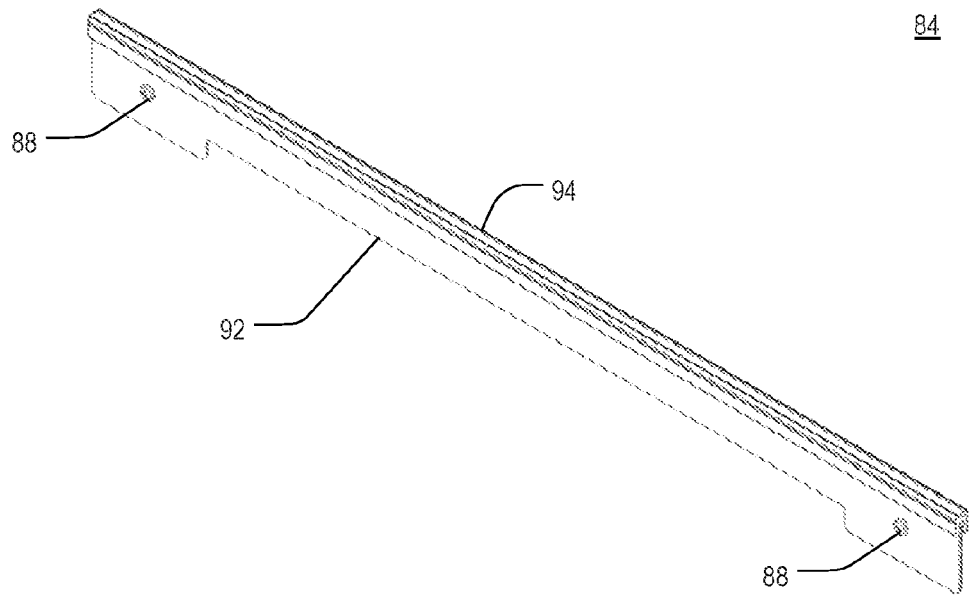
FIG. 10 is an isometric view of the upper rail seal of FIG. 8.
Figure 11:
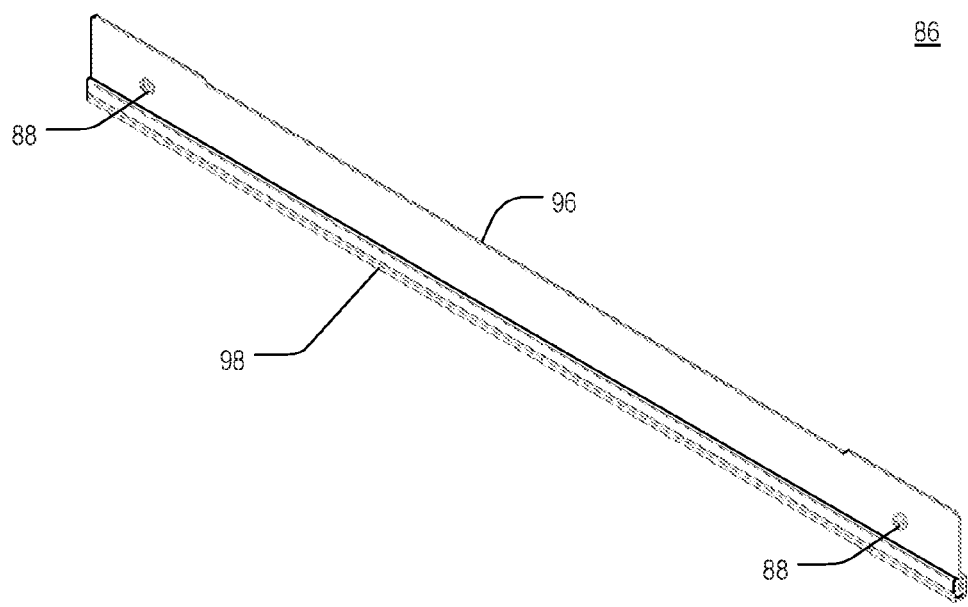
FIG. 11 is an isometric view of the lower rail seal of FIG. 8.

FIG. 10 is an isometric view of the upper rail seal 84 of FIG. 8, and FIG. 11 is an isometric view of the lower rail seal 86 of FIG. 8. As shown in FIG. 10, the upper rail seal 84 includes an upper rail seal panel 92 and a seal 94. Likewise, as shown in FIG. 11, the lower rail seal 86 includes a lower rail seal panel 96 and a seal 98. Each seal 94,98 may be clamped or otherwise attached along a horizontal edge of the respective upper and lower rail seal panels 92,96, thereby providing the rail seals 84,86 with flexible sealing surfaces along edges thereof. In particular, seals 94,98 are clamped at outer-facing edges of the rail seal panels 92,96, which may interface with and rest against respective top and bottom panels of the enclosure 10. In this regard, the rail seals 40 provide a horizontal air dam at the interior of the enclosure 10 between the vertical mounting rails 30 and the top and bottom panels of the enclosure 10. Seals 94,98 may have any of a wide variety of shapes and configurations, including the configurations depicted in FIGS. 4A, 6 and 7. Seals 94,98 are preferably made from a compliant, flexible material. In one contemplated embodiment, seals 94,98 are composed of a rubber material.

The upper rail seal panel 92 is adapted to be attached at its ends via fasteners 88 to upper ends of the pair of vertical mounting rails 30. Likewise, the lower rail seal panel 96 is adapted to be attached at its ends via fasteners 88 to lower ends of the pair of vertical mounting rails 30. Fasteners 88 may be any of a variety of different fastening mechanisms, such as self-tapping screws.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. An electronic equipment enclosure comprising:
   a frame structure comprised of a plurality of interconnected vertical support posts and horizontal cross members;
   one or more panels mounted on the frame structure, the frame structure and the one or more panels together defining an enclosed space for electronic equipment, the one or more panels at least including a side panel disposed at a side of the enclosed space;
   at least one separate mounting rail mounted within the enclosed space to at least one of the horizontal cross members of the frame structure; and
   a rail seal including a flat panel portion and a deflectable portion disposed along an edge of the flat panel portion, the rail seal being attached to the at least one separate mounting rail such that a flat surface of the flat panel portion is disposed against a flat mounting surface of the at least one separate mounting rail;
   wherein the flat panel portion of the rail seal is oriented generally perpendicularly relative to the side panel such that the deflectable portion is pressed directly against, and is deflected by, the side panel, thereby providing an air dam within the enclosed space between the side panel and the at least one separate mounting rail.

2. The electronic equipment enclosure of claim 1, wherein the rail seal further includes one or more grommet ports in the flat panel portion that align with openings provided in the flat mounting surface of the at least one separate mounting rail, thereby facilitating the routing of cables through both the flat panel portion of the rail seal and the at least one separate mounting rail.

3. The electronic equipment enclosure of claim 1, wherein the deflectable portion includes an internal cavity extending substantially the length thereof.

4. The electronic equipment enclosure of claim 1, wherein the deflectable portion is shaped as a wiper blade, a distal end of which interfaces with the side panel to establish the air dam.

5. The electronic equipment enclosure of claim 1, wherein the deflectable portion includes a bumper that interfaces with the side panel to establish the air dam.

6. The electronic equipment enclosure of claim 1, wherein the deflectable portion includes one or more notches that interface with the side panel to establish the air dam.

7. The electronic equipment enclosure of claim 1, wherein the side panel includes an edge geometry that fittingly corresponds with an inset portion of an adjoining horizontal cross member.

8. An electronic equipment enclosure comprising:
   a frame structure comprised of:
      a pair of front vertical support posts connected together by a plurality of horizontal front cross members to define a front frame, and a pair of rear vertical support posts connected together by a plurality of horizontal rear cross members to define a rear frame; and
      a plurality of horizontal side cross members connecting the pair of front vertical support posts of the front frame to the pair of rear vertical support posts of the rear frame;
   one or more panels mounted on the frame structure, the frame structure and the one or more panels together defining an enclosed space for electronic equipment, the one or more panels at least including a side panel disposed at a side of the enclosed space;
   at least one separate mounting rail, oriented vertically and mounted within the enclosed space to at least one of the plurality of horizontal side cross members of the frame structure; and
   a rail seal attached to the at least one separate mounting rail, the rail seal including a panel portion and a deflectable portion disposed along an edge of the panel portion;

wherein the panel portion of the rail seal is oriented generally perpendicularly relative to the side panel such that the deflectable portion is pressed directly against, and is deflected by, the side panel, thereby providing an air dam within the enclosed space between the side panel and the at least one separate mounting rail.

9. The electronic equipment enclosure of claim 8, wherein the rail seal further includes one or more grommet ports in the panel portion for routing of cables therethrough.

10. The electronic equipment enclosure of claim 8, wherein the deflectable portion includes a pair of extension arms that define a channel for receiving the edge of the panel portion.

11. The electronic equipment enclosure of claim 10, wherein the deflectable portion includes a hooked tab for engaging the edge of the panel portion received between the pair of extension arms.

12. The electronic equipment enclosure of claim 8, wherein the deflectable portion includes an internal cavity extending substantially the length thereof.

13. The electronic equipment enclosure of claim 8, wherein the deflectable portion is shaped as a wiper blade, a distal end of which interfaces with the side panel to establish the air dam.

14. The electronic equipment enclosure of claim 8, wherein the deflectable portion includes a bumper that interfaces with the side panel to establish the air dam.

15. The electronic equipment enclosure of claim 8, wherein the deflectable portion includes one or more notches that interface with the side panel to establish the air dam.

16. The electronic equipment enclosure of claim 8, wherein the deflectable portion is composed of a rubber material.

17. The electronic equipment enclosure of claim 8, wherein the side panel includes an edge geometry that fittingly corresponds with an inset portion of an adjoining horizontal side cross member.

18. The electronic equipment enclosure of claim 17, wherein the side panel includes a compliant seal at the edge geometry, thereby providing an air dam between the side panel and the adjoining horizontal side cross member.

19. The electronic equipment enclosure of claim 8, wherein the panel portion includes a notched area for accommodating a cable manager bracket mounted along a side of the at least one separate mounting rail.

20. The electronic equipment enclosure of claim 19, wherein the cable manager bracket, together with a finger cable manager mounted along an opposite side of the at least one separate mounting rail, defines a cable manager.

* * * * *